(12) United States Patent
Chen et al.

(10) Patent No.: US 9,406,499 B2
(45) Date of Patent: Aug. 2, 2016

(54) SEMICONDUCTOR WAFER STRUCTURE

(71) Applicant: TAIWAN SEMICONDUCTOR MANUFACTURING COMPANY LTD., Hsinchu (TW)

(72) Inventors: Chen-Chun Chen, Tainan (TW); Chiu-Jung Chen, Tainan (TW); Fu-Tsun Tsai, Tainan (TW); Shiu-Ko Jangjian, Tainan (TW); Chi-Cherng Jeng, Tainan (TW); Hsin-Chi Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/178,814

(22) Filed: Feb. 12, 2014

(65) Prior Publication Data

US 2015/0228720 A1    Aug. 13, 2015

(51) Int. Cl.
*H01L 23/544*    (2006.01)
*H01L 21/02*    (2006.01)
*H01L 27/146*    (2006.01)

(52) U.S. Cl.
CPC ...... *H01L 21/02019* (2013.01); *H01L 27/1464* (2013.01); *H01L 27/14687* (2013.01)

(58) Field of Classification Search
CPC ............... H01L 23/544; H01L 2223/54453; H01L 2223/5442; H01L 2223/54426; G03F 9/7076
USPC ........................................................ 257/797
See application file for complete search history.

(56) References Cited

U.S. PATENT DOCUMENTS

| | | | |
|---|---|---|---|
| 2006/0286490 A1* | 12/2006 | Sandhu et al. ................ 430/394 |
| 2014/0048926 A1* | 2/2014 | Wang .................. H01L 23/3178 257/737 |
| 2014/0361420 A1* | 12/2014 | Yilmaz .................. H01L 24/40 257/676 |
| 2015/0021743 A1* | 1/2015 | Adderly ............ H01L 21/30604 257/618 |

FOREIGN PATENT DOCUMENTS

TW    201128745 A1    8/2011

OTHER PUBLICATIONS

Official Action issued by Taiwan Patent Office on Sep. 10, 2015.

* cited by examiner

*Primary Examiner* — Hoai V Pham
(74) *Attorney, Agent, or Firm* — Chun-Ming Shih

(57) ABSTRACT

A semiconductor structure includes a wafer including a first surface and a periphery, a plurality of protrusions protruded from the first surface and a plurality of recesses spaced from each other by the plurality of protrusions, and each of the plurality of recesses is extended from the periphery of the wafer and is elongated across the first surface of the wafer.

20 Claims, 12 Drawing Sheets

SEMICONDUCTOR WAFER STRUCTURE

BACKGROUND

Electronic equipment using semiconductor device are essential for many modern applications. With the advancement of electronic technology, electronic equipment is becoming increasingly smaller in size while having greater functionality and greater amounts of integrated circuitry. Thus, the semiconductor device inside the electronic equipment is also becoming denser, smaller and more compact. The continuous demands for a size reduction of semiconductor device has made it necessary to develop more integrated circuits that can be accommodated within the semiconductor devices.

The major trend in the electronic industry is to make the semiconductor device smaller and more multifunctional. The semiconductor device comprises an electrical interconnection structure for electrically connecting a number of metallic structures between adjacent layers of the semiconductor device so as to minimize the final size of the semiconductor device as well as the electronic equipment. In a field of microelectronics as well as three dimensional wafer level integration, a technology of wafer bonding is applied to support the dense and multifunctional semiconductor device. The semiconductor device includes two or more wafers which are bonded together by different principles such as direct bonding or interlayer bonding.

Numerous manufacturing operations are implemented within such a small and high performance semiconductor device. Thus, manufacturing the semiconductor device in a miniaturized scale becomes more complicated. An increase in a complexity of manufacturing the semiconductor device may cause deficiencies such as poor coplanarity of bonded wafers, inaccurate wafer bonding, poor reliability of the electrical interconnection, and development of cracks within components. Thus, there is a continuous need to improve the method for manufacturing the semiconductor device in order to solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
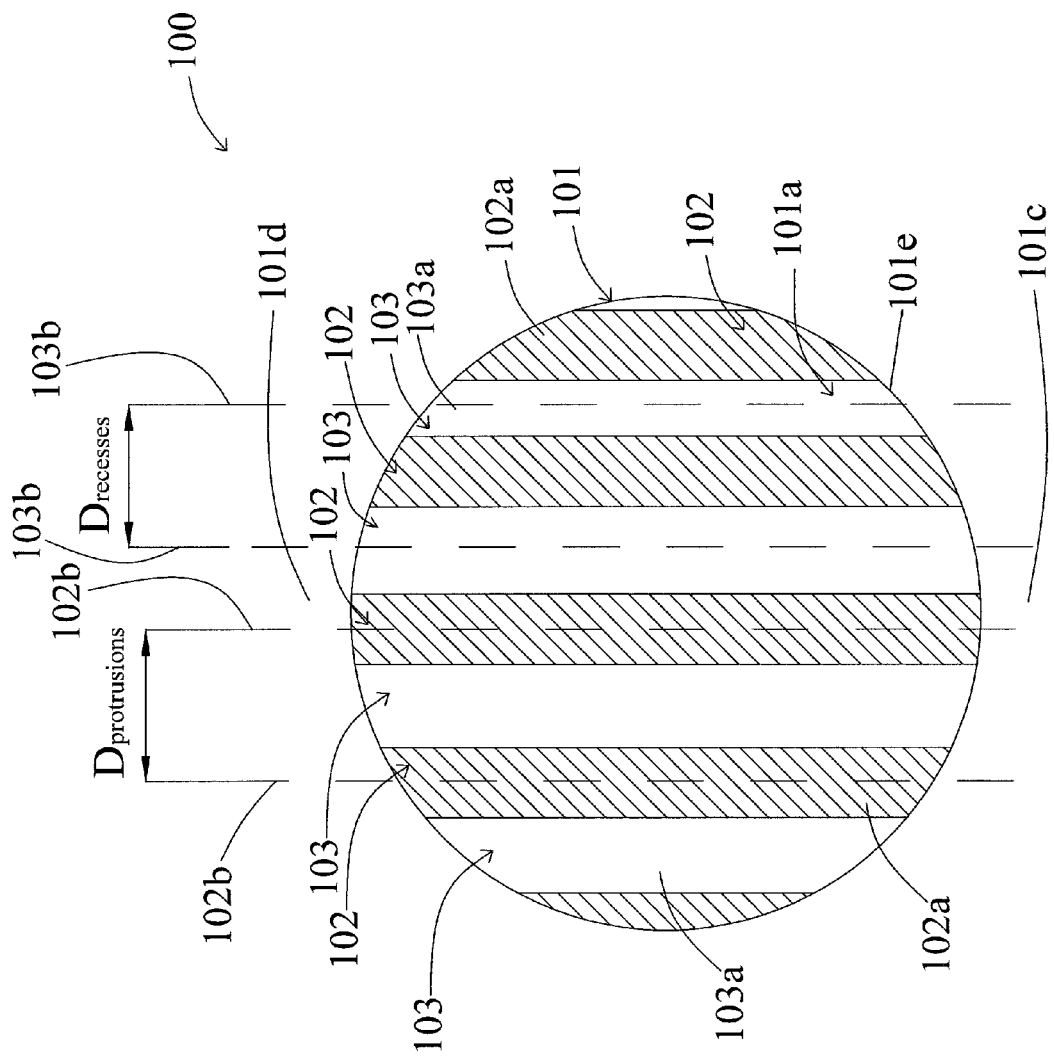
FIG. 1A is a schematic view of a semiconductor structure with several protrusions or recesses in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor image sensors are commonly involved in optoelectronic equipment. A backside illuminated (BSI) complementary metal-oxide-semiconductor (CMOS) image sensors (CIS) device is one type of image sensor device. The BSI image sensor device includes a photodetector which absorbs a radiation projected towards a backside of the device wafer and converts the radiation into an electrical signal. The BSI image sensor device is fabricated by bonding the device wafer to a carrier wafer. A surface of a top side of the device wafer is prepared and activated, such that the device wafer can be directly bonded with the carrier wafer under a predetermined annealing temperature and pressure.

However, some air particles or moisture are trapped between the device wafer and the carrier wafer upon the wafer bonding operation. The air or moisture trapped between the wafers would then expand under the annealing temperature, and thus the bonded wafers would have a poor coplanarity. The trapped air or moisture would even break the wafers or develop some cracks within the bonded wafers. Furthermore, the bonded wafers trapped with air or moisture would be easily broken during a thinning of the backside of the device wafer. As a result, the bonded wafers would have a poor reliability and a high yield loss.

In the present disclosure, a semiconductor structure with a structural improvement is disclosed. The semiconductor structure includes a number of protrusions or a number of recesses on a surface of a carrier wafer. The surface of the carrier wafer disposed with the protrusions or recesses is contacted and bonded with a top side of a device wafer. As such, air particles or moisture between the device wafer and the carrier wafer can be evacuated from the protrusions or recesses out of the wafers upon a wafer bonding operation. Therefore, air or moisture trapped between the device wafer and the carrier wafer can be minimized or even prevented, and thus a surface coplanarity and a reliability of the bonded wafers can be improved.

FIG. 1A is a diagram of a semiconductor structure 100 in accordance with various embodiments of the present disclosure. The semiconductor structure 100 includes a wafer 101. In some embodiments, the wafer 101 is a carrier wafer or a handle wafer. In some embodiments, the wafer 101 is configured for supporting another wafer with a very thin thickness. The wafer 101 provides a mechanical support to another wafer which would be subsequently processed by various operations. In some embodiments, the wafer 101 includes semiconductor materials such as silicon. In some embodiments, the wafer 101 is in a circular, quadrilateral or polygonal shape.

In some embodiments, the wafer 101 includes a first surface 101a and a periphery 101e. In some embodiments, the wafer 101 includes a number of protrusions 102 disposed on the first surface 101a of the wafer 101. In some embodiments, the protrusions 102 are protruded from the first surface 101a of the wafer 101. In some embodiments, the protrusions 102 are integral with the wafer 101, that the protrusions 102 are integrally formed with the wafer 101. In some embodiments, the protrusions 102 include same materials as the wafer 101. In some embodiments, the protrusions 102 are separately formed from the wafer 101. In some embodiments, the protrusions 102 are individual from the wafer 101. In some embodiments, the protrusions 102 include materials different from the wafer.

In some embodiments, the protrusions 102 are disposed horizontally along the first surface 101a. In some embodiments, the protrusions 102 are elongated across the first surface 101a of the wafer 101. In some embodiments, each of the protrusions 102 is extended from one side 101c to an opposite side 101d of the wafer 101. In some embodiments, each protrusion 102 has a top surface 102a which is in a substantially rectangular or quadrilateral shape. In some embodiments, the protrusions 102 include silicon.

In some embodiments, the protrusions 102 are spaced from each other. In some embodiments, the protrusions 102 are intervally disposed on the first surface 101a of the wafer 101. In some embodiments, the protrusions 102 are spaced from each other in a consistent interval $D_{protrusions}$. In some embodiments, the interval $D_{protrusions}$ is a distance between centers 102b of the adjacent protrusions 102. In some embodiments, the protrusions 102 are spaced from each other in the interval $D_{protrusions}$ of about 20 mm to about 50 mm.

In some embodiments, the wafer 101 includes a number of recesses 103 disposed on the first surface 101a of the wafer 101. In some embodiments, the recesses 103 are disposed horizontally along the first surface 101a. In some embodiments, the recesses 103 are elongated across the first surface 101a of the wafer 101. In some embodiments, each of the recesses 103 is extended from the periphery 101e of the wafer 101 and is elongated across the first surface 101a of the wafer 101. In some embodiments, each of the recesses 103 is extended from the side 101c to the opposite side 101d of the wafer 101. In some embodiments, the recesses 103 are substantially parallel to each other. In some embodiments, each recess 103 has a bottom surface 103a which is in a substantially rectangular or quadrilateral shape. In some embodiments, the bottom surface 103a of the recess 103 is coplanar with the first surface 101a of the wafer 101.

In some embodiments, the recesses 103 are spaced from each other by the protrusions 102. In some embodiments, the recesses 103 are intervally disposed on the first surface 101a of the wafer 101. In some embodiments, the recesses 103 are spaced from each other in a consistent interval $D_{recesses}$. In some embodiments, the interval $D_{recesses}$ is a distance between centers 103b of the adjacent recesses 103. In some embodiments, the recesses 103 are spaced from each other in the interval $D_{recesses}$ of about 20 mm to about 50 mm.

In some embodiments, there is an area ratio of the protrusions 102 to the recesses 103 on the first surface 101a of the wafer 101. In some embodiments, the area ratio of the protrusions 102 to the recesses 103 is a ratio of a total area of the top surfaces 102a of the protrusions 102 to a total area of the bottom surfaces 103a of the recesses 103. In some embodiments, the area ratio is about 1:10 to about 1:2. In some embodiments, the total area of the top surfaces 102a of the protrusions 102 is about 10% to about 50% of an area of the first surface 101a of the wafer 101. In some embodiments, the total area of the bottom surfaces 103a of the recesses 103 is about 10% to about 50% of an area of the first surface 101a of the wafer 101.

Figure 1B:
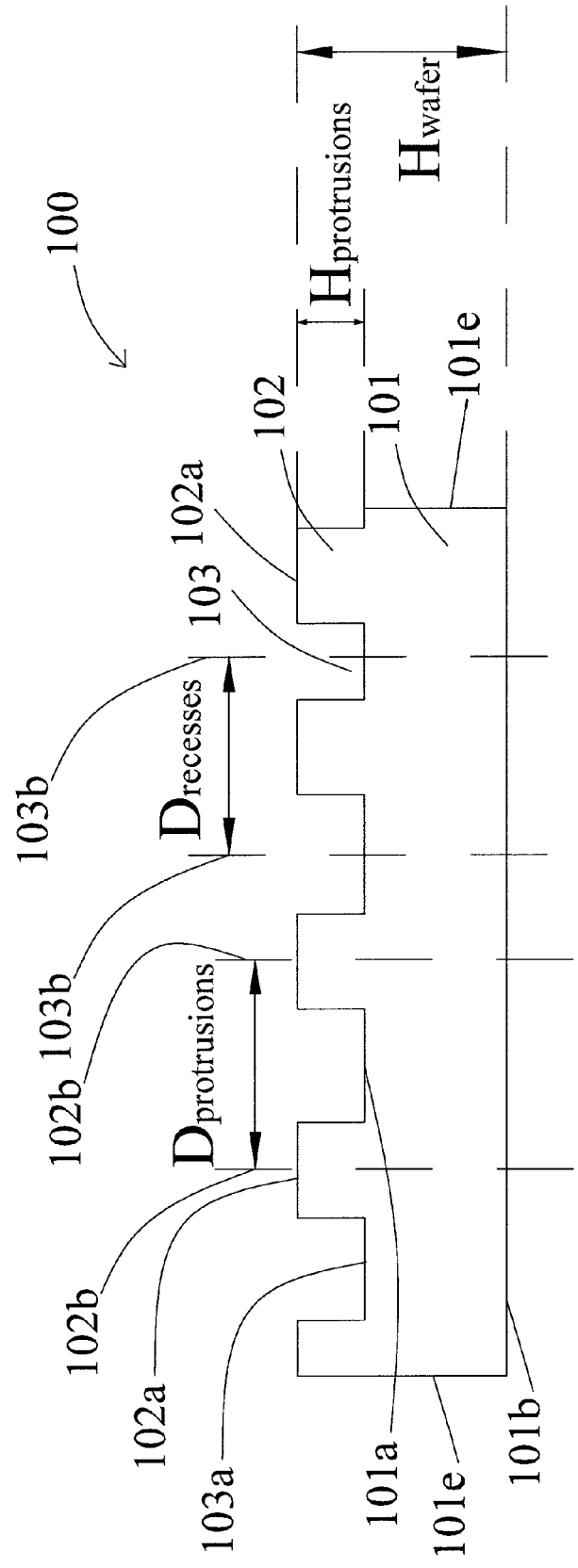
FIG. 1B is a side view of a semiconductor structure as in FIG. 1A in accordance with some embodiments.

FIG. 1B is a side view of the semiconductor structure 100 in accordance with various embodiments of the present disclosure. In some embodiments, the protrusions 102 are protruded from the first surface 101a of the wafer 101 and spaced from each other by the recesses 103. In some embodiments, the protrusions 102 are spaced from each other in a distance $D_{protrusions}$. In some embodiments, the recesses 103 are spaced from each other in a distance $D_{recesses}$. In some embodiments, each of the protrusions 102 is surrounded by at least two adjacent recesses 103. In some embodiments, each of the recesses 103 is surrounded by at least two adjacent protrusions 102.

In some embodiments, each of the protrusions 102 has a height $H_{protrusions}$ of about 100 um to about 500 um from the first surface 101a of the wafer 101 to the top surface 102a of the protrusion 102. In some embodiments, the wafer 101 has a thickness $H_{wafer}$ of about 400 um to about 800 um. In some embodiments, the thickness $H_{wafer}$ of the wafer 101 is about 750 um. In some embodiments, a ratio of the height $H_{protrusions}$ of the protrusion 102 to the thickness $H_{wafer}$ of the wafer 101 is about 1:2 to about 1:50.

Figure 2A:
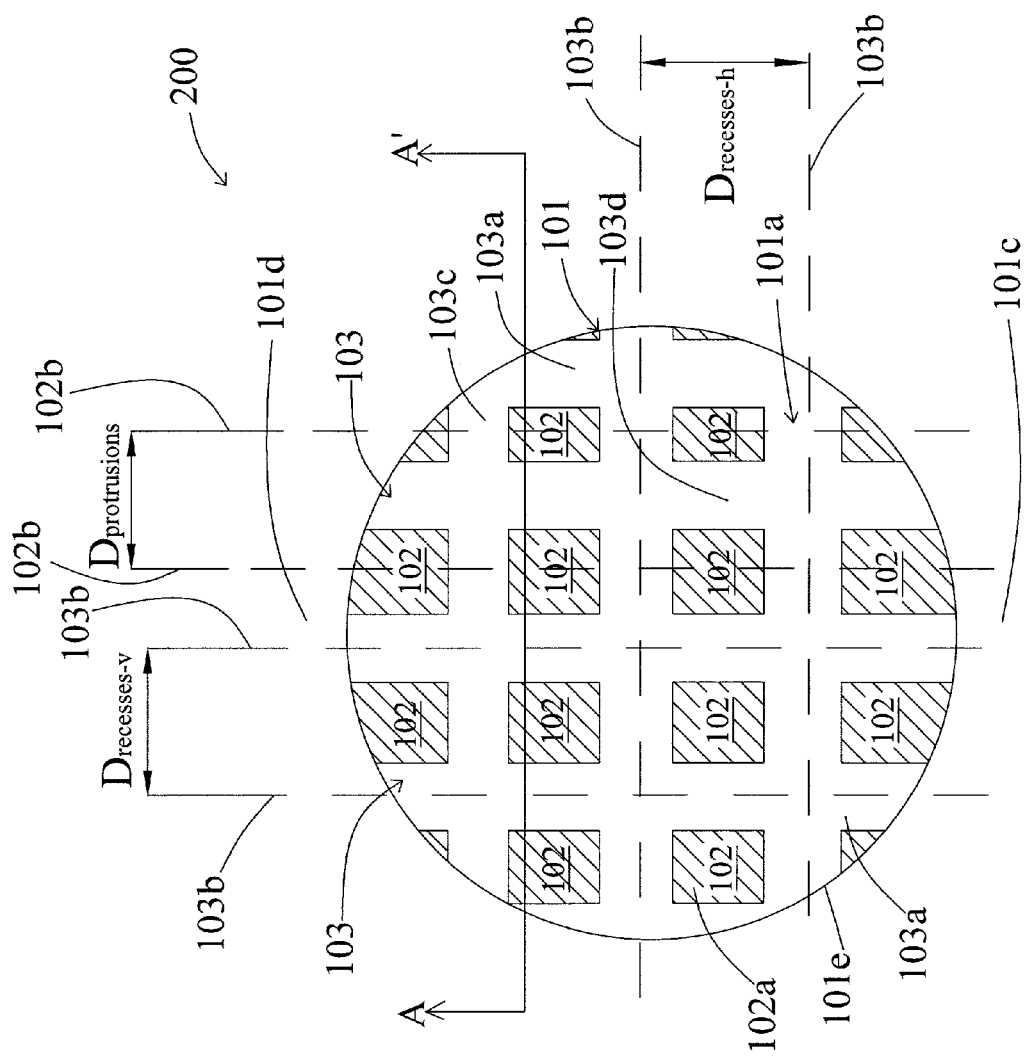
FIG. 2A is a schematic view of a semiconductor structure with several horizontal recesses and several vertical recesses in accordance with some embodiments.

FIG. 2A is a diagram of a semiconductor structure 200 in accordance with various embodiments of the present disclosure. In some embodiments, the semiconductor structure 200 includes a wafer 101. In some embodiments, the wafer 101 includes a number of recesses 103 on a first surface 101a of the wafer 101. In some embodiments, the recesses 103 are disposed on the first surface 101a of the wafer 101 in a mesh pattern. In some embodiments, the recesses 103 include a number of horizontal recesses 103c and a number of vertical recesses 103d. The horizontal recesses 103c are extended horizontally across the wafer 101, and the vertical recesses 103d are extended vertically across the wafer 101.

In some embodiments, the horizontal recesses 103c are spaced from each other in an interval $D_{recesses-h}$. In some embodiments, the interval $D_{recesses-h}$ is a distance between centers 103b of the adjacent horizontal recesses 103c. In some embodiments, the vertical recesses 103d are spaced from each other in an interval $D_{recesses-v}$. In some embodiments, the interval $D_{recesses-v}$ is a distance between centers 103b of the adjacent vertical recesses 103d.

In some embodiments, a number of protrusions 102 are disposed on the first surface 101a of the wafer 101. In some embodiments, the protrusions 102 are spaced from each other by the horizontal recesses 103c and the vertical recesses 103d. In some embodiments, adjacent protrusions 102 are spaced by one of the horizontal recesses 103c or the vertical recesses 103d in a distance $D_{protrusions}$. In some embodiments, a top surface 102a of the protrusion 102 is in a substantially rectangular, quadrilateral or polygonal shape.

Figure 2B:
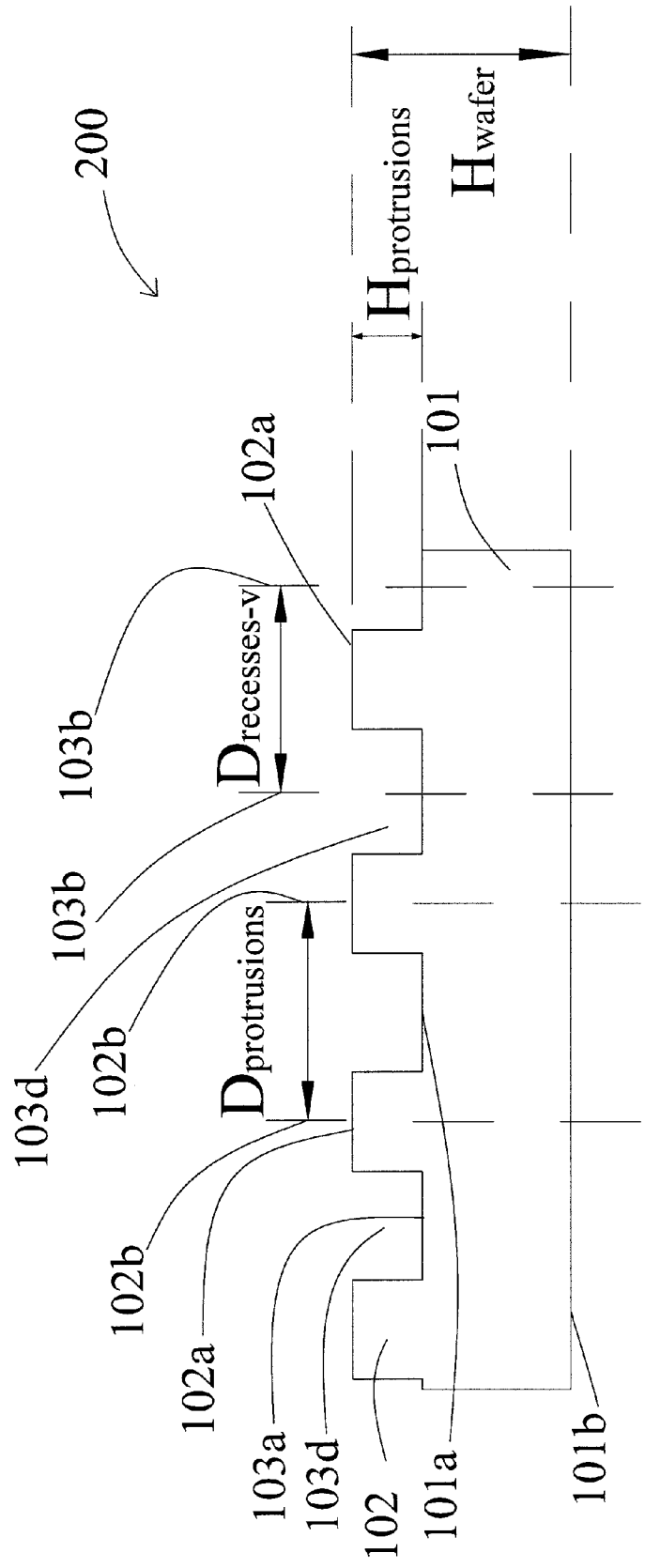
FIG. 2B is a side view of a semiconductor structure as in FIG. 2A in accordance with some embodiments.

FIG. 2B is a side view of the semiconductor structure 200 along AA' in accordance with various embodiments of the present disclosure. In some embodiments, the protrusions 102 are protruded from the first surface 101a of the wafer 101 and spaced from each other by the recesses 103.

In some embodiments, the protrusions 102 are spaced from each other in a distance $D_{protrusions}$. In some embodiments, the vertical recesses 103d are spaced from each other in a distance $D_{recesses-v}$. In some embodiments, each of the protrusions 102 is surrounded by at least two adjacent vertical recesses 103d. In some embodiments, each of the vertical recesses 103d is surrounded by at least two adjacent protrusions 102.

Figure 3:
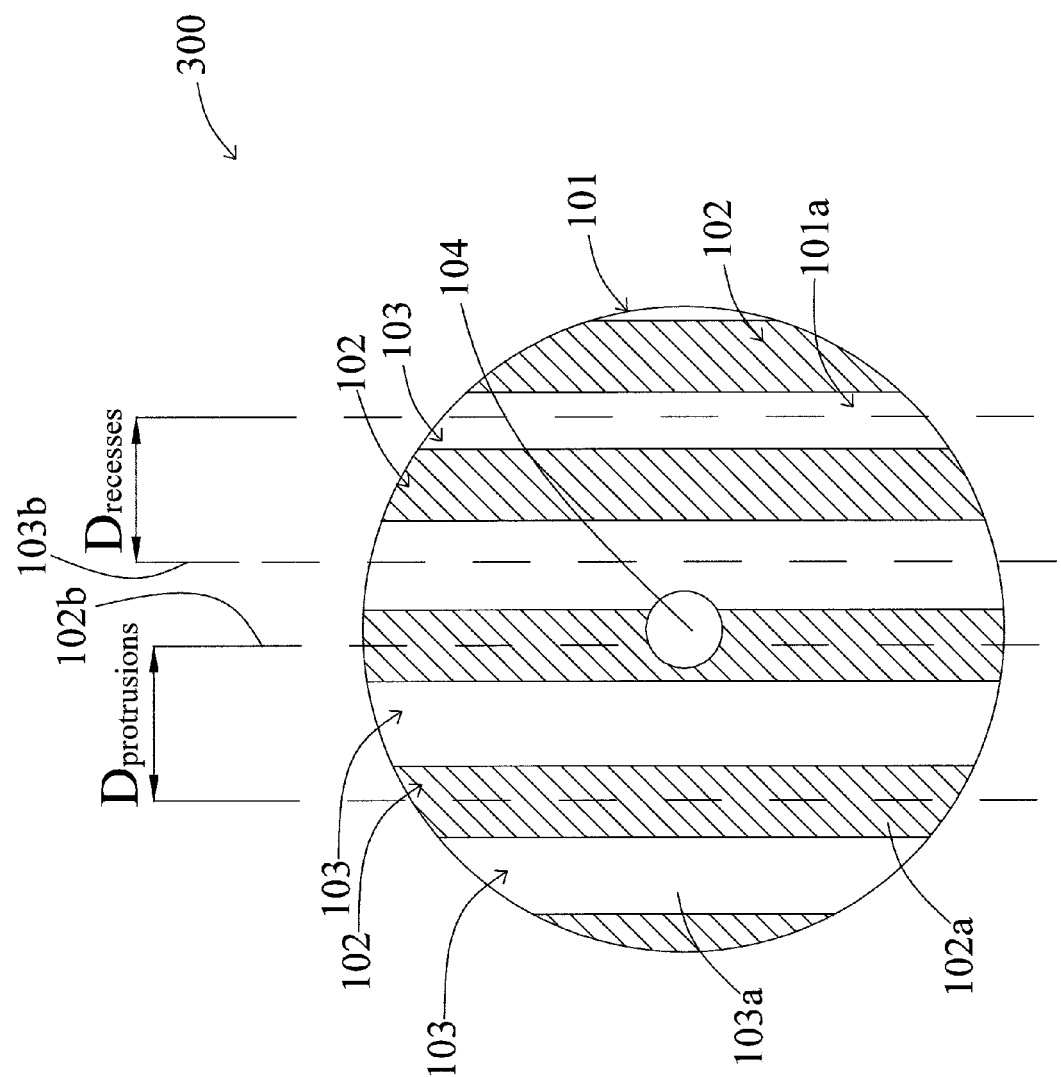
FIG. 3 is a schematic view of a semiconductor structure with a hole at a center in accordance with some embodiments.

FIG. 3 is a diagram of a semiconductor structure 300 in accordance with various embodiments of the present disclosure. In some embodiments, the semiconductor structure 300 includes a wafer 101. In some embodiments, the wafer 101 includes a number of protrusions 102 protruded from a first surface 101a of the wafer 101. In some embodiments, the wafer 101 includes a number of recesses 103 disposed on the first surface 101a.

In some embodiments, the wafer 101 includes a hole 104. In some embodiments, the hole 104 is disposed at a center of the wafer 101. In some embodiments, the hole 104 is perforated from the first surface 101a to a second surface opposite to the first surface 101a of the wafer 101. In some embodiments, the hole 104 is concentric with the wafer 101. In some embodiments, the hole 104 is in a circular, rectangular, quadrilateral or polygonal shape. In some embodiments, the hole 104 is configured for holding the wafer 101 upon wafer bonding operation.

Figure 4:
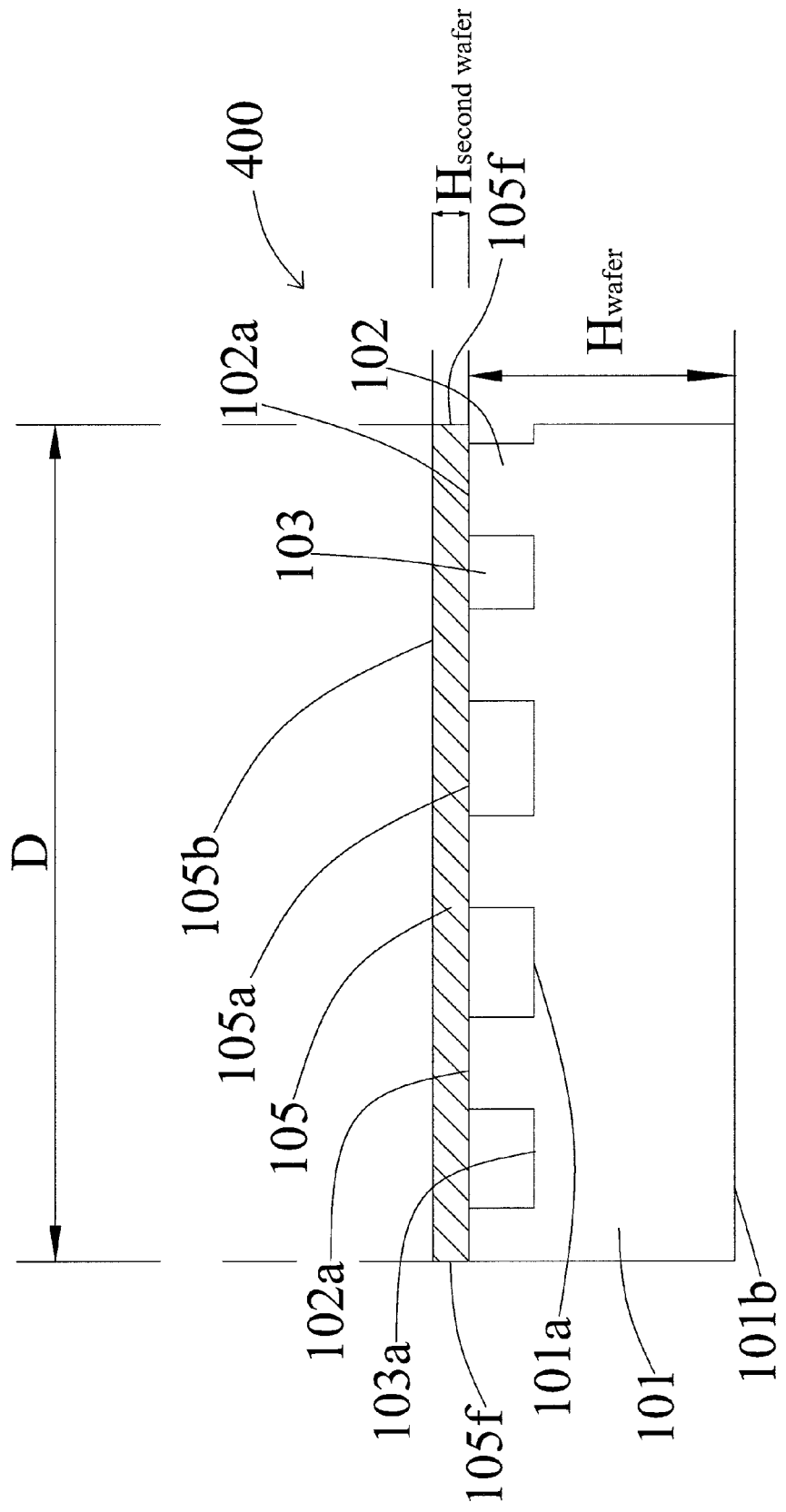
FIG. 4 is a schematic view of a semiconductor structure with a first wafer bonded with a second wafer in accordance with some embodiments.

FIG. 4 is a diagram of a semiconductor structure 400 in accordance with various embodiments of the present disclosure. In some embodiments, the semiconductor structure 400 includes a first wafer 101 and a second wafer 105. In some embodiments, the first wafer 101 is in a similar configuration as the wafer 101 in FIG. 1A and FIG. 1B. In some embodiments, the first wafer 101 includes a number of protrusions 102 protruded from a first surface 101a of the first wafer 101. In some embodiments, the first wafer 101 includes a number of recesses 103 disposed on the first surface 101a.

In some embodiments, the semiconductor structure 400 includes a second wafer 105. In some embodiments, the second wafer 105 is a device wafer. In some embodiments, the second wafer 105 includes a second surface 105a for receiving and bonding with another wafer. In some embodiments, the second wafer 105 includes a periphery 105f. In some embodiments, the second wafer 105 includes a number of circuits within the second wafer 105. In some embodiments, a number of conductive traces are disposed within the second wafer 105 for connecting a number of components within the second wafer 105.

In some embodiments, the second wafer 105 is a sensor wafer which is fabricated by CMOS process techniques known in the art and is assembled to become a backside illuminated image (BSI) sensor. In some embodiments, the second wafer 105 includes a transistor (not shown). The transistor generates a signal related to an intensity or a brightness of light impinged from a third surface 105b opposite to the second surface 105a.

In some embodiments, the second wafer 105 is bonded with the first wafer 101. In some embodiments, the second wafer 105 is disposed on the protrusions 102 of the first wafer 101. In some embodiments, the second surface 105a of the second wafer 105 is bonded with the protrusions 102 of the first wafer 101. In some embodiments, the protrusions 102 are protruded from the first surface 101a of the first wafer 101 to the second surface 105a of the second wafer 105. In some embodiments, each of the protrusions 102 has a top surface 102a disposed on the second surface 105a of the second wafer 105.

In some embodiments, a number of recesses 103 are disposed between the first wafer 101 and the second wafer 105. In some embodiments, the recesses 103 are disposed between the first surface 101a of the first wafer 101 and the second surface 105a of the second wafer 105. In some embodiments, the recesses 103 are spaced from each other by the protrusions 102. In some embodiments, each of the recesses 103 is extended from the periphery 105f of the second wafer 105 and is elongated across the second surface 105a of the second wafer 105. In some embodiments, each of the recesses 103 is surrounded by the first surface 101a, the second surface 105a and the protrusions 102. In some embodiments, the recesses 103 are configured for evacuating air or moisture out of the first wafer 101 and the second wafer 105 during a wafer bonding operations.

In some embodiments, the first wafer 101 and the second wafer 105 are in a substantially same dimension and shape. In some embodiments, the first wafer 101 and the second wafer have substantially same diameter D. In some embodiments, the first wafer 101 and the second wafer are in a circular shape. In some embodiments, the first wafer 101 is aligned with the second wafer 105.

In some embodiments, the second wafer 105 has a thickness $H_{second\ wafer}$ of about 1 um to about 5 um. In some embodiments, the thickness $H_{second\ wafer}$ of the second wafer 105 is about 2 um to about 2.5 um. In some embodiments, the thickness $H_{second\ wafer}$ of the second wafer 105 is much smaller than the thickness $H_{wafer}$ of the first wafer 101.

In some embodiments, there is a total interfacing area between the protrusions 102 of the first wafer 101 and the second surface 105a of the second wafer 105. In some embodiments, the total interfacing area is a total area where the second surface 105a is contacted with the top surfaces 102a of the protrusions 102.

In some embodiments, there is a ratio of the total interfacing area to an area of the second surface 105a of the second wafer 105. In some embodiments, the ratio of the total interfacing area to the area of the second surface 105a is about 1:10 to about 1:2. In some embodiments, the total interfacing area is about 10% to about 50% of the area of the second surface 105a.

Figure 5:
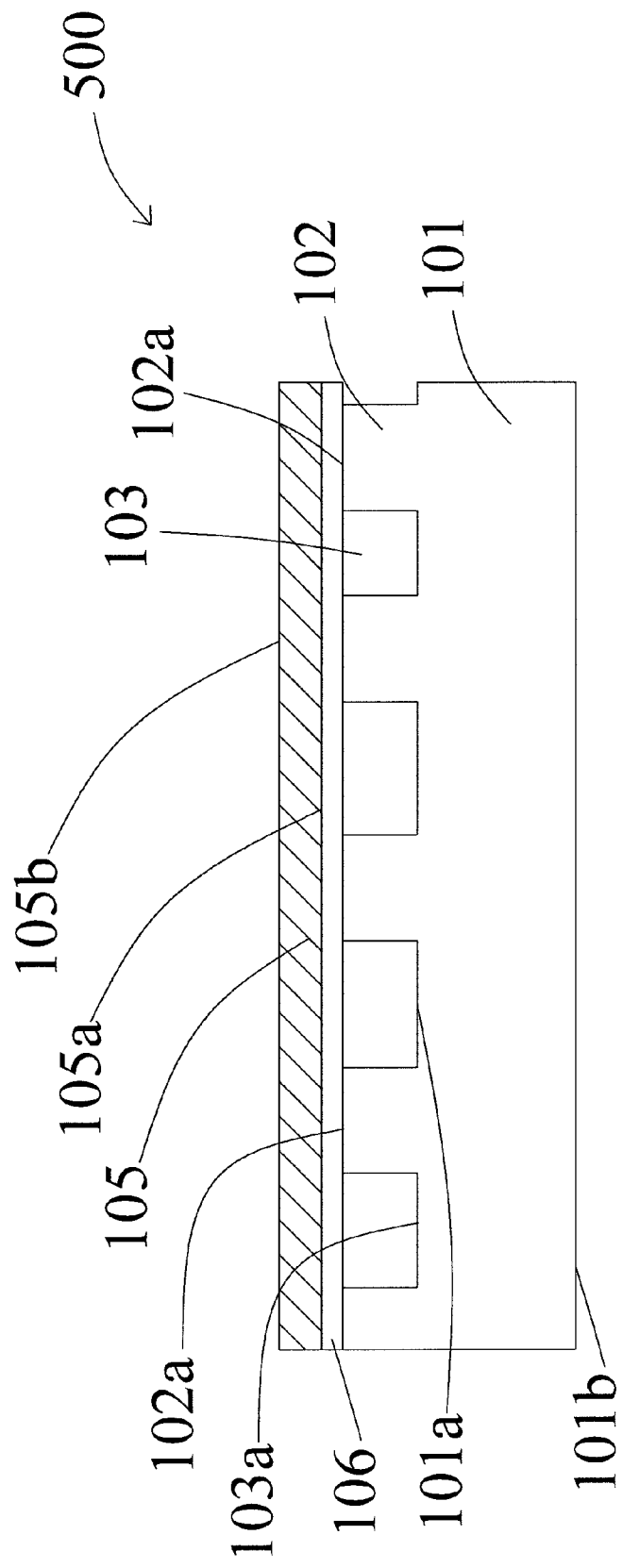
FIG. 5 is a schematic view of a semiconductor structure with a first wafer bonded with a second wafer by an intermediate layer in accordance with some embodiments.

FIG. 5 is a diagram of a semiconductor structure 500 in accordance with various embodiments of the present disclosure. In some embodiments, the semiconductor structure 500 includes a first wafer 101 and a second wafer 105. In some embodiments, the first wafer 101 is in a similar configuration as the wafer 101 in FIG. 1A and FIG. 1B. In some embodiments, the second wafer 105 is in a similar configuration as the second wafer 105 in FIG. 4.

In some embodiments, an intermediate layer 106 is disposed between the first wafer 101 and the second wafer 105. In some embodiments, the intermediate layer 106 is configured for bonding the first wafer 101 and the second wafer 105. In some embodiments, the intermediate layer 106 includes gold, aluminum, tin, germanium or etc. In some embodiments, the intermediate layer 106 is an adhesive. In some embodiments, the intermediate layer 106 includes polymers, polyimides, spin-on glasses or etc.

In the present disclosure, a method of manufacturing a semiconductor structure is also disclosed. In some embodiments, a semiconductor structure is formed by a method 600. The method 600 includes a number of operations and the description and illustration are not deemed as a limitation as the sequence of the operations.

Figure 6:
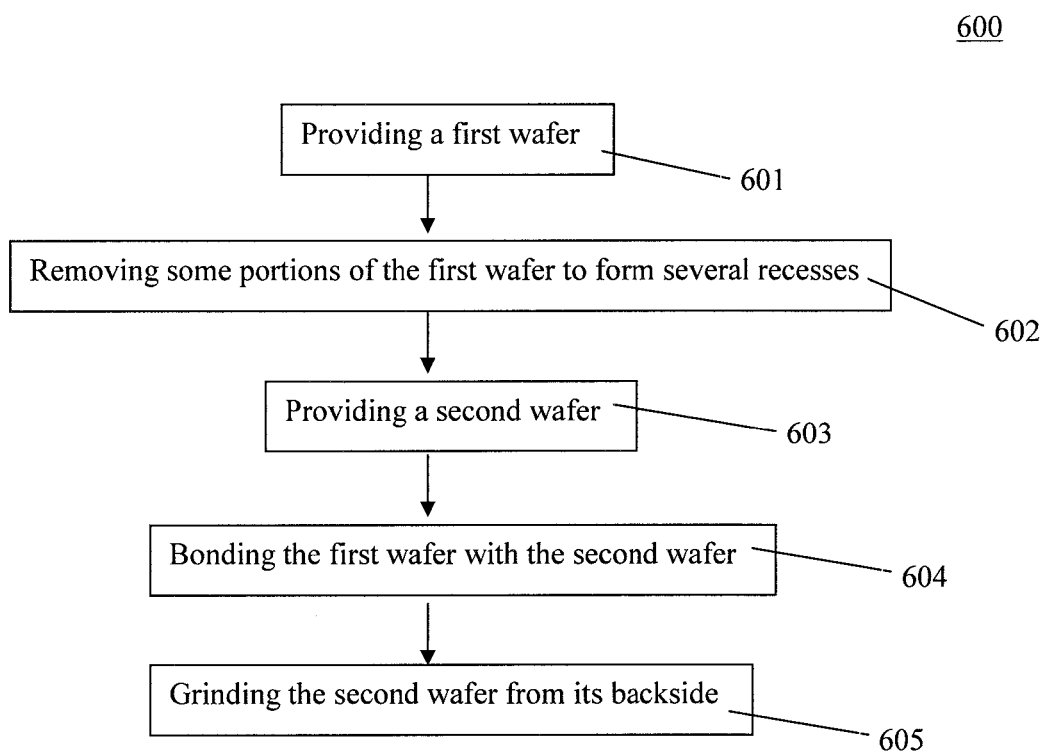
FIG. 6 is a flow diagram of a method of manufacturing a semiconductor structure in accordance with some embodiments.

FIG. 6 is a flowchart of a method 600 of manufacturing a semiconductor structure in accordance with various embodiments of the present disclosure. The method 600 includes a number of operations (601, 602, 603, 604 and 605).

Figure 6B:
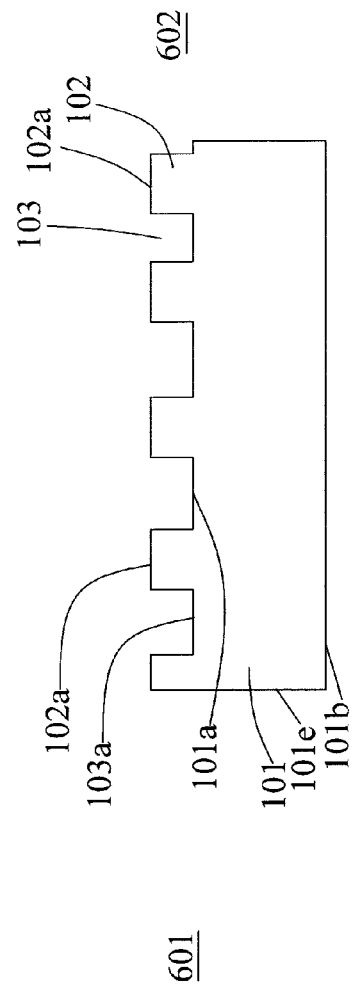
FIG. 6B is a schematic view of a first wafer with several protrusions in accordance with some embodiments.
Figure 6A:
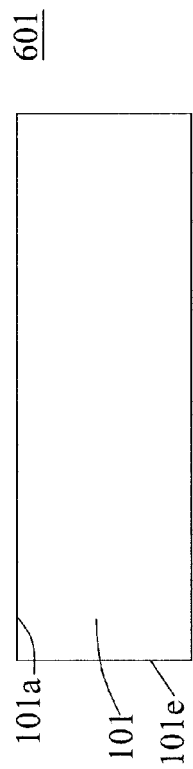
FIG. 6A is a schematic view of a first wafer in accordance with some embodiments.

In operation 601, a first wafer 101 is provided as in FIG. 6A. In some embodiments, the first wafer 101 is a carrier wafer or a handle wafer for supporting another wafer. In some embodiments, the first wafer 101 includes semiconductor materials such as silicon. In some embodiments, the first wafer 101 is in a circular, quadrilateral or polygonal shape. In some embodiments, the first wafer 101 includes a first surface 101a and a periphery 101e. In some embodiments, the first wafer 101 has a thickness of about 400 um to about 800 um. The thickness of the first wafer 101 is able to resist a warpage of the first wafer 101.

In operation 602, some portions of the first wafer 101 are removed from the first surface 101a to form a number of recesses 103 over the first surface 101a as in FIG. 6B. In some embodiments, each of the recesses 103 is extended from the periphery 101e of the first wafer 101 and is elongated across the first surface 101a of the first wafer 101.

In some embodiments, several protrusions 102 are formed when the recesses 103 are formed. In some embodiments, the protrusions 102 are formed on the first surface 101a of the first wafer 101. In some embodiments, the protrusions 102 are protruded from the first surface 101a. In some embodiments, the recess 103 is disposed between adjacent protrusions 102. In some embodiments, the protrusions 102 are spaced from each other by the recesses 103. In some embodiments, a bottom surface 103a of the recess 103 is coplanar with the first surface 101a.

In some embodiments, the recesses 103 or the protrusions 102 are formed by etching operations such as reactive ion etching (RIE), dry etching, an anisotropic wet etching or the like. In some embodiments, the recesses 103 or the protrusions 102 are formed by photolithography and etching.

In some embodiments, a photoresist is disposed on the first surface 101a of the first wafer 101. In some embodiments, the photoresist is a light sensitive material with chemical properties depending on an exposure of light. In some embodiments, the photoresist is sensitive to an electromagnetic radiation such as an ultra violet (UV) light, that the chemical properties of the photoresist are changed upon exposure to the UV light. In some embodiments, the photoresist is evenly disposed on the first surface 101a by spin coating.

In some embodiments, the photoresist is a positive photoresist. The positive photoresist exposed to the UV light is dissolvable by a developer solution, while the positive photoresist unexposed to the UV light is not dissolvable by the developer solution. In some embodiments, the photoresist is a negative photoresist. The negative photoresist exposed to the UV light is not dissolvable by a developer solution, while the negative photoresist unexposed to the UV light is dissolvable by the developer solution.

In some embodiments, a photomask with a predetermined pattern is provided and disposed above the first surface 101a of the first wafer 101. In some embodiments, the photomask includes silica, glass or etc. In some embodiments, the photomask has the predetermined pattern corresponding to positions of the protrusions 102 or the recesses 103 to be formed on the first surface 101a.

In some embodiments, the photomask includes several light passing portions and several light blocking portions. In some embodiments, the light passing portion allows an electromagnetic radiation such as UV light to pass through, while the light blocking portion does not allow the electromagnetic radiation to pass through. In some embodiments, the light passing portions and the light blocking portions are intervally disposed and are corresponded to the positions of the protrusions 102 or the recesses 103.

In some embodiments, the electromagnetic radiation is projected on the photoresist through the photomask. The electromagnetic radiation passes through the light passing portions of the photomask, while the electromagnetic radiation is blocked by the light blocking portions of the photomask. Thus, the photoresist receives the electromagnetic radiation corresponding to the predetermined pattern of the photomask.

In some embodiments, the photoresist including several exposed portions and several unexposed portions is developed after the projection of the electromagnetic radiation on the photoresist through the photomask. The exposed portions and the unexposed portions are developed in accordance with the predetermined pattern of the photomask. If the photoresist is the positive photoresist, the exposed portions are dissolvable by a developer solution and the unexposed portions is not dissolvable by the developer solution. If the photoresist is the negative photoresist, the exposed portions are not dissolvable by a developer solution and the unexposed portions is dissolvable by the developer solution.

In some embodiments, the photomask is removed after the projection of the electromagnetic radiation and a developer solution is sprayed on the photoresist. In some embodiments, the developer solution selectively dissolves the photoresist in accordance with the predetermined pattern. Thus, some of the photoresist are dissolved by the developer solution 110, while some of the photoresist are remained on the first surface 101a of the first wafer 101. In some embodiments, the developer solution includes sodium hydroxide, nonionic base solutions or organic solutions. In some embodiments, the developer solution and the portions of the photoresist dissolved by the developer solution are removed.

In some embodiments, some portions of the first wafer 101 are removed to form several protrusions 102 or recesses 103 on the first surface 103a as in FIG. 6B. In some embodiments, some portions of the first wafer 101 without coverage of the photoresist are etched away by a suitable etching operation such as plasma etching, an anisotropic dry etching, a reactive ion etching (RIE), a dry etching or etc. In some embodiments, some portions of the first wafer 101 corresponding to the positions of the recesses 103 are removed, as such the protrusions 102 are formed on the first surface 101a of the first wafer 101.

In some embodiments, the protrusions 102 or the recesses 103 are formed by laser operation. In some embodiments, a laser beam is projected on the first surface 101a of the first wafer 101 to remove some portions of the first wafer 101 in order to form the protrusions 102 on the first surface 101a.

Figure 6C:
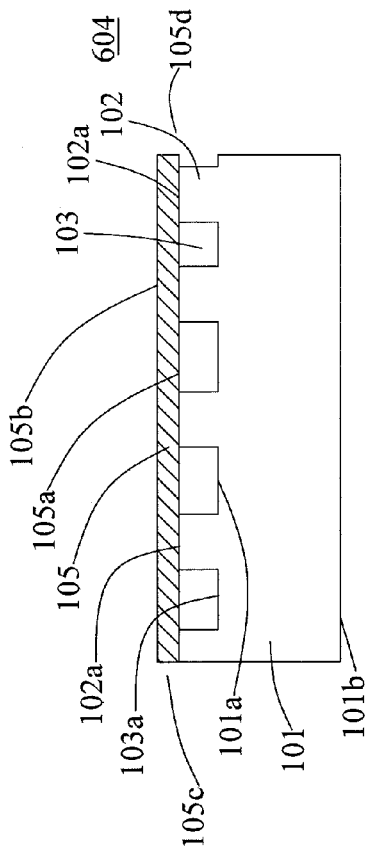
FIG. 6C is a schematic view of a first wafer and a second wafer in accordance with some embodiments.

In operation 603, a second wafer 105 is provided as in FIG. 6C. In some embodiments, the second wafer 105 is a device wafer. In some embodiments, the second wafer 105 is a sensor wafer which is fabricated by CMOS process techniques known in the art and is assembled to become a backside illuminated image (BSI) sensor.

In some embodiments, the second wafer 105 includes a second surface 105a and a third surface 105b. In some embodiments, the second surface 105a is an active side of the second wafer 105. In some embodiments, a number of circuits including components and conductive traces are disposed on the active side of the second wafer 105. In some embodiments, the third surface 105b is a backside of the second wafer 105.

In some embodiments, the second wafer 105 has a substantially same dimension and shape as the first wafer 101. In some embodiments, the second wafer 105 has a substantially same diameter as the first wafer 101. In some embodiments, the second wafer 105 has a thickness much less than a thickness of the first wafer 101. In some embodiments, the second wafer 105 is in a circular shape. In some embodiments, the second wafer 105 includes silicon.

Figure 6D:
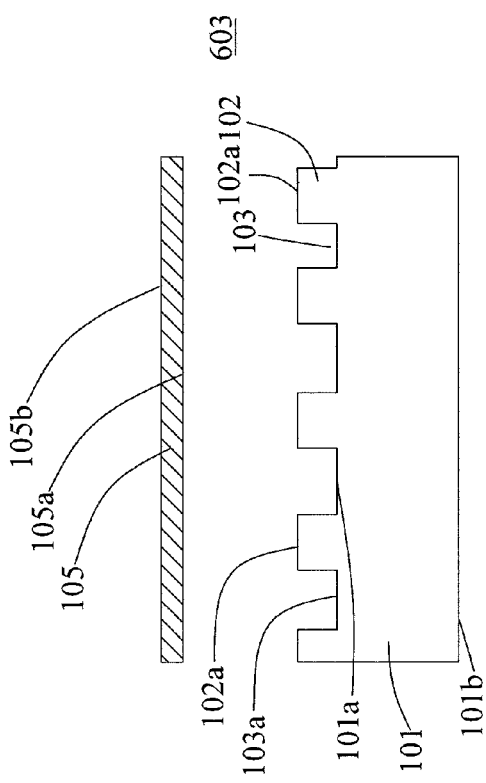
FIG. 6D is a schematic view of a first wafer bonded with a second wafer in accordance with some embodiments.

In operation 604, the second wafer 105 is disposed on the first wafer 101 to bond the second wafer 105 with the first wafer 101 as in FIG. 6D. In some embodiments, the second surface 105a of the second wafer 105 is disposed on the protrusions 102 of the first wafer 101 to bond the first wafer 101 with the second wafer 105. In some embodiments, the second wafer 105 is bonded with the first wafer 101 by the protrusions 102, such that the recesses 103 are disposed between the first wafer 101 and the second wafer 105. In some embodiments, top surfaces 102a of the protrusions 102 contact and bond with the second surface 105a. In some embodiments, the first wafer 101 is aligned with the second wafer 105 before disposing the second wafer 105 on the first wafer 101.

In some embodiments, the second surface 105a and the top surface 102a of the protrusions 102 are bonded by any suitable methods such as direct bonding, fusion bonding, eutectic wafer bonding, adhesive wafer bonding or etc.

In some embodiments, the second wafer 105 is directly bonded with the first wafer 101. In some embodiments, a pressure is applied on the second wafer 105 to bond the second surface 105a with the top surfaces 102a of the protrusions 102. In some embodiments, the pressure is evenly applied on the third surface 105b of the second wafer 105 or a fourth surface 101b of the first wafer 101 opposite to the first surface 101a.

Figure 6F:
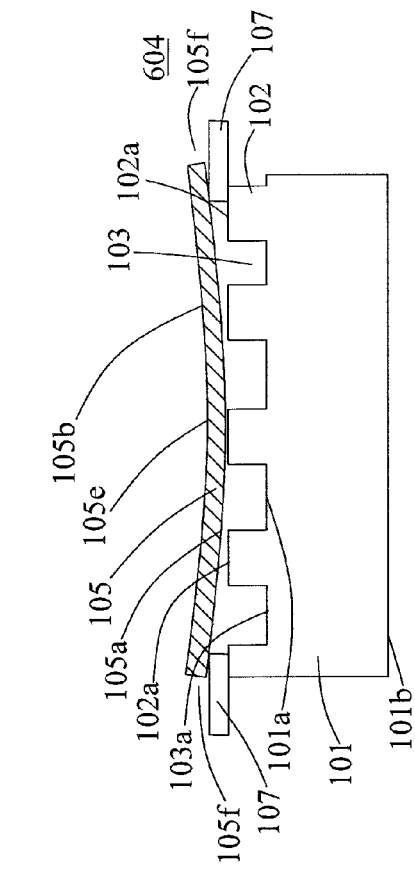
FIG. 6F is a schematic view of a second wafer disposed on a first wafer from a center of the second wafer in accordance with some embodiments.
Figure 6E:
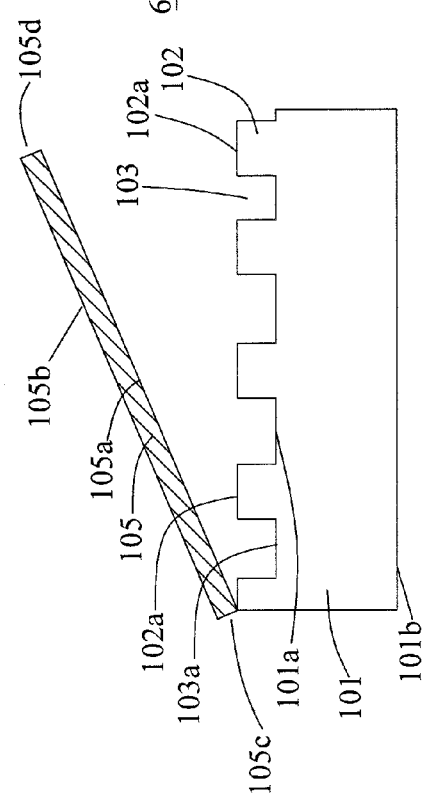
FIG. 6E is a schematic view of a second wafer disposed on a first wafer from a side to an opposite side of the second wafer in accordance with some embodiments.

In some embodiments as in FIG. 6E, the pressure is applied from a first side 105c to a second side 105d of the second wafer 105, such that the pressure is spread from the first side 105c to the second side 105d, and thus the second surface 105a is bonded with the top surface 102a as shown in FIG. 6D.

In some embodiments as in FIG. 6F, the pressure is applied at a center 105e of the third surface 105b of the second wafer 105, such that the pressure is propagated from the center 105e towards a periphery 105f of the second wafer 105, and thus the second surface 105a is bonded with the top surface 102a as shown in FIG. 6D.

In some embodiments as in FIG. 6F, a spacer 107 is disposed between the first wafer 101 and the second wafer 105 and at the periphery of the first wafer 101 or the second wafer 105. The spacer 107 is withdrawn from the first wafer 101 and the second wafer 105 when the pressure is spread towards the periphery 105f.

In some embodiments, the first wafer 101 and the second wafer 105 are treated under an annealing temperature of about 1000° C. when the second wafer 105 is disposed on the first wafer 101, so that a bond is establish between molecules from the second surface 105a and the top surface 102a of the protrusions 102, and thus the second surface 105a and the top surfaces 102a are permanently bonded together as shown in FIG. 6D.

In some embodiments, the second surface 105a and the first surface 101a are prepared by any suitable methods before bonding the second wafer 105 with the first wafer 101. In some embodiments, the second surface 105a and the top surfaces 102a of the protrusions 102 are activated by applying a chemical solution or exposing to a plasma. In some embodiments, the first wafer 101 and the second wafer 105 are placed between a pair of electrodes respectively, and thus are exposed to the plasma to activate the top surface 102a and the second surface 105a respectively.

In some embodiments, the activated second surface 105a and the activated top surface 102a are under an annealing temperature of about a room temperature to about 500° C. so as to bond the second wafer 105 with the first wafer 101. In some embodiments, the anneal temperature for bonding the activated second surface 105a and the activated top surface 102a is about 200° C. to about 400° C. As the second surface 105a and the top surface 102a are activated before the bonding operation, a lower annealing temperature is required for bonding the second wafer 105 and the first wafer 101.

Figure 6H:
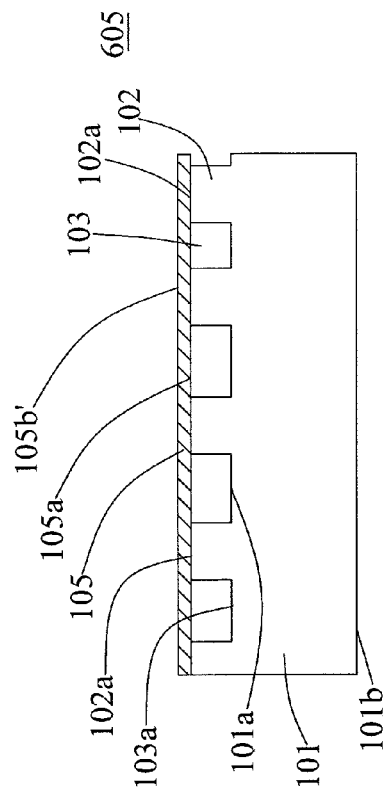
FIG. 6H is a schematic view of a second wafer with a reduced thickness in accordance with some embodiments.
Figure 6G:
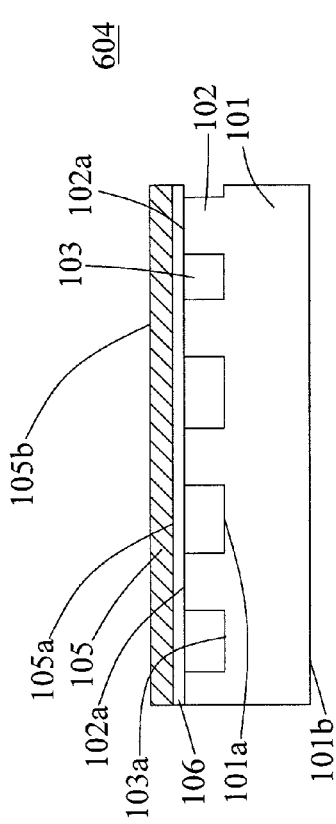
FIG. 6G is a schematic view of a first wafer bonded with a second wafer by an intermediate layer in accordance with some embodiments.

In some embodiments as in FIG. 6G, an intermediate layer 106 is disposed between the first wafer 101 and the second wafer 105 and is configured for bonding the first wafer 101 and the second wafer 105. In some embodiments, the intermediate layer 106 is disposed on the second surface 105a of the second wafer 105 by spin coating. In some embodiments, the intermediate layer 106 is an adhesive. In some embodiments, the intermediate layer 106 includes polymers, polyimides, spin-on glasses or etc.

In some embodiments, the second surface 105a is bonded with the top surface 102a by the intermediate layer 106 under an annealing temperature of about room temperature to about 500° C. In some embodiments, the second surface 105a is bonded with the top surface 102a by the intermediate layer 106 under a predetermined pressure. In some embodiments, the second wafer 105 with the intermediate layer 106 is bonded with the first wafer 101 by disposing the second wafer 105 on the first wafer 101 from one side to another opposite side of the second wafer 105 as the way in FIG. 6E, or from a center to a periphery of the second wafer 105 as the way in FIG. 6F.

In operation 605, some of the second wafer 105 is removed from the third surface 105b towards the second surface 105a of the second wafer 105 as in FIG. 6H. In some embodiments, some of the second wafer 105 is removed by grinding, etching or polishing. In some embodiments, the third surface 105b is a backside of the second wafer 105. The grinding is implemented on the backside of the second wafer 105.

In some embodiments, the third surface 105b is ground in order to reduce the thickness of the second wafer 105. In some embodiments, the third surface 105b is ground towards the second surface 105a and becomes a new third surface 105b'. In some embodiments, the thickness of the second wafer 105 is reduced to about 1 um to about 5 um.

In some embodiments, a number of optical elements such as color filters or lenses are added to the second wafer 105, such that the second wafer 105 is fabricated to become a sensing component and is assembled to become a backside illuminated image sensor.

In the present disclosure, a semiconductor structure includes a number of protrusions or a number of recesses on a surface of a carrier wafer. The protrusions or the recesses facilitates an evacuation of air or moisture upon bonding the carrier wafer with a device wafer, such that the air or moisture trapped between the device wafer and the carrier wafer can be minimized or even prevented. Therefore, a surface coplanarity of the bonded wafers is improved, and a crack within the carrier wafer or the device wafer is prevented. As a result, a reliability of the bonded wafers is increase.

In some embodiments, a semiconductor structure includes a wafer including a first surface and a periphery, a plurality of protrusions are protruded from the first surface and a plurality of recesses are spaced from each other by the plurality of protrusions, and each of the plurality of recesses is extended from the periphery of the wafer and is elongated across the first surface of the wafer.

In some embodiments, the plurality of recesses are substantially parallel to each other. In some embodiments, the wafer is a carrier wafer or a handle wafer including silicon. In some embodiments, an area ratio of the plurality of protrusions to the plurality of recesses is about 1:10 to about 1:2.

In some embodiments, the plurality of protrusions or the plurality of recesses are intervally disposed. In some embodiments, the plurality of protrusions or the plurality of recesses are spaced from each other in a consistent interval. In some embodiments, the wafer is in a circular shape, and each of the plurality of protrusions has a top surface in a rectangular or quadrilateral shape.

In some embodiments, the wafer includes a hole disposed at a center of the wafer and perforated from the first surface to a second surface of the wafer opposite to the first surface. In some embodiments, each of the plurality of protrusions has a height of about 100 um to about 500 um. In some embodiments, the wafer has a thickness of about 400 um to about 800 um. In some embodiments, the plurality of recesses include a horizontal recess and a vertical recess orthogonal to the horizontal recess.

In some embodiments, a semiconductor structure includes a first wafer including a first surface, a second wafer including a second surface and a periphery, a plurality of protrusions are protruded from the first surface of the first wafer to the second surface of the second wafer and are bonded with the second surface of the second wafer, and a plurality of recesses disposed between the first wafer and the second wafer and spaced from each other by the plurality of protrusions, and each of the plurality of recesses extended from the periphery of the second wafer and elongated across the second surface of the second wafer.

In some embodiments, each of the plurality of protrusions has a top surface disposed on the second surface of the second wafer. In some embodiments, the first wafer and the second wafer are in substantially same dimension and shape. In some embodiments, the second wafer is a device wafer with a thickness of about 1 um to about 5 um. In some embodiments, a ratio of a total interfacing area between the plurality of protrusions and the second surface to an area of the second surface is about 1:10 to about 1:2.

In some embodiments, a method of manufacturing a semiconductor structure includes providing a first wafer including a first surface and a periphery, removing some portions of the first wafer from the first surface to form a plurality of recesses over the first surface, and each of the plurality of recesses is extended from the periphery of the first wafer and is elongated across the first surface of the first wafer, providing a second wafer including a second surface, and bonding the second wafer with the first wafer thereby the plurality of recesses are disposed between the first wafer and the second wafer.

In some embodiments, the removing some portions of the first wafer includes etching or laser operation. In some embodiments, the removing some portions of the first wafer includes disposing a photoresist on the first surface and exposing the photoresist through a photomask in a predetermined pattern corresponding to positions of the plurality of recesses. In some embodiments, the removing some portions of the first wafer including forming a plurality of protrusions protruded from the first surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first wafer including a plurality of protrusions protruded from and elongated across the first wafer;
a second wafer including a second surface attached with the plurality of protrusions,
wherein a plurality of passages are intervally configured between the plurality of protrusions and elongated across the first wafer and the second surface of the second wafer.

2. The semiconductor structure of claim 1, wherein the plurality of passages are substantially parallel to each other.

3. The semiconductor structure of claim 1, wherein the first wafer is a carrier wafer or a handle wafer including silicon.

4. The semiconductor structure of claim 1, wherein an area ratio of the plurality of protrusions to the plurality of passages is about 1:10 to about 1:2.

5. The semiconductor structure of claim 1, wherein the plurality of passages are configured to evacuate air or moisture along each of the plurality of passages disposed.

6. The semiconductor structure of claim 1, wherein the plurality of protrusions are spaced from each other in a consistent interval.

7. The semiconductor structure of claim 1, wherein the first wafer or the second wafer is in a circular shape, and each of the plurality of protrusions has a top surface in a rectangular or quadrilateral shape.

8. The semiconductor structure of claim 1, wherein the plurality of protrusions are integrally formed with the first wafer.

9. The semiconductor structure of claim 1, wherein each of the plurality of protrusions has a height of about 100 um to about 500 um.

10. The semiconductor structure of claim 1, wherein the first wafer has a thickness of about 400 um to about 800 um.

11. The semiconductor structure of claim 1, wherein the plurality of protrusions include silicon.

12. A semiconductor structure, comprising:
a first wafer including a first surface and a first periphery;
a second wafer including a second planar surface and a second periphery;
a plurality of protrusions protruded from the first surface of the first wafer and attached to the second planar surface of the second wafer to bond the first wafer with the second wafer; and
a plurality of recesses disposed between the first wafer and the second wafer and spaced from each other by the plurality of protrusions, and each of the plurality of recesses is extended from the second periphery of the second wafer, elongated across the second surface of the second wafer, and configured to evacuate air or moisture between the first surface and the second planar surface out from the first periphery or the second periphery.

13. The semiconductor structure of claim 12, wherein each of the plurality of protrusions has a top surface disposed on the second planar surface of the second wafer.

14. The semiconductor structure of claim 12, wherein the first wafer and the second wafer are in substantially same dimension and shape.

15. The semiconductor structure of claim 12, wherein the second wafer is a device wafer with a thickness of about 1 um to about 5 um.

16. The semiconductor structure of claim 12, wherein a ratio of a total interfacing area between the plurality of protrusions and the second planar surface to an area of the second planar surface is about 1:10 to about 1:2.

17. A semiconductor structure, comprising:
a carrier wafer including a plurality of protrusions protruded from and elongated across the carrier wafer; and
a device wafer including a surface attached with the plurality of protrusions; and
a passage disposed between two of the plurality of protrusions, and configured to allow air or moisture flowing along the passage.

18. The semiconductor structure of claim 17, wherein the plurality of protrusions are extended parallel to each other.

19. The semiconductor structure of claim 17, wherein the air or the moisture is laterally evacuatable along the passage.

20. The semiconductor structure of claim 17, wherein each of the plurality of protrusions includes an end disposed adjacent to a periphery of the carrier wafer or the device wafer.

* * * * *